United States Patent [19]

Hong

[11] Patent Number: 5,429,970
[45] Date of Patent: Jul. 4, 1995

[54] METHOD OF MAKING FLASH EEPROM MEMORY CELL

[75] Inventor: Gary Hong, Hsin-chu, Taiwan

[73] Assignee: United Microelectronics Corporation, Hsinchu, Taiwan

[21] Appl. No.: 276,605

[22] Filed: Jul. 18, 1994

[51] Int. Cl.$^6$ ................ H01L 21/266; H01L 21/8247
[52] U.S. Cl. ........................................ 437/43; 437/52; 257/316
[58] Field of Search ............................. 437/43, 48, 52; 257/315, 316

[56] References Cited

U.S. PATENT DOCUMENTS

| | | | |
|---|---|---|---|
| 4,975,384 | 12/1990 | Baglee | 437/43 |
| 5,045,490 | 9/1991 | Esquivel et al. | 437/43 |
| 5,049,515 | 9/1991 | Tzeng | 437/43 |
| 5,071,782 | 12/1991 | Mori | 437/48 |
| 5,141,886 | 8/1992 | Mori | 437/43 |
| 5,180,680 | 1/1993 | Yang | 437/38 |
| 5,281,548 | 1/1994 | Prall | 437/43 |

*Primary Examiner*—Olik Chaudhuri
*Assistant Examiner*—Richard A. Booth
*Attorney, Agent, or Firm*—George O. Saile

[57] ABSTRACT

A new method of obtaining an improved coupling ratio and short channel effect in a Flash EEPROM memory cell is shown. A trench is etched into a semiconductor substrate. A thick gate oxide layer is formed over the surface of the substrate and within the trench. A layer of silicon nitride is deposited and anisotropically etched away to leave spacers on the sidewalls of the trench. The spacers are overetched to expose an upper portion of the gate oxide layer on the trench sidewalls. The gate oxide layer not covered by the spacers is removed, exposing the horizontal silicon surface of the substrate in the bottom of the trench and the upper portion of the silicon sidewalls of the trench above the spacers. A tunnel oxide layer is grown on the exposed silicon surfaces of the substrate and within the trench wherein the controllable small area of tunnel oxide within the trench provides an improved coupling ratio and the long channel afforded by the trenched channel region improves the short channel effect of the memory cell. The silicon nitride spacers are removed. A first polysilicon layer is deposited within the trench. An interpoly dielectric layer is deposited over the first polysilicon layer followed by a second polysilicon layer. The layers are patterned to form a stacked polysilicon structure wherein the first polysilicon layer forms a floating gate and the second polysilicon layer forms a control gate. Source and drain regions are formed on either side of the stacked polysilicon structure.

25 Claims, 4 Drawing Sheets

METHOD OF MAKING FLASH EEPROM MEMORY CELL

BACKGROUND OF THE INVENTION (1) Field of the Invention

The invention relates to a method of fabricating semiconductor memory devices employing floating gates, and more particularly, to a method of improving coupling ratios of semiconductor memory devices employing floating gates.

(2) Description of the Prior Art

One class of semiconductor memory devices employ floating gates; that is, gates which are completely surrounded by an insulating layer, such as a silicon oxide. The presence or absence of charge in the floating gates represents binary information. These are called electrically programmable read only memories (EPROM). EEPROMS are erasable electrically programmable read only memories. "Flash" memory devices are those in which all of the cells can be erased in a single operation.

A typical Flash EEPROM of the prior art is illustrated in FIG. 1. A thin tunnel oxide layer 12 is formed on the surface of a semiconductor substrate 10. The tunnel oxide is necessary for the erasing function of the cell. The memory cell consists of the floating gate 14, interpoly dielectric layer 16, and the control gate 18. Source and drain regions 20 are shown on either side of the gate structure. Several problems exist with the prior art memory cell. The coupling ratio of the cell is low because of the thin tunnel oxide which exists over the entire channel area. As the size of the cell shrinks to the sub-micron regime, it suffers from short channel effect. That is, the transistor's threshold voltage and drain to source punchthrough voltage are reduced.

U.S. Pat. Nos. 5,180,680 to M. T. Yang and 5,049,515 to Tzeng show EEPROMs using a trench process.

SUMMARY OF THE INVENTION

A principal object of the present invention is to provide an effective and very manufacturable method of fabricating a flash EEPROM memory cell.

Another object of the present invention is to provide a method of providing an improved coupling ratio in a flash EEPROM memory cell.

Yet another object of the invention is to provide a method of providing reduced short channel effect in sub-micron memory cells.

In accordance with the objects of this invention a new method of obtaining an improved coupling ratio and reduced short channel effect in a Flash EEPROM memory cell employing a small controllable tunnel oxide is achieved. Field oxide regions are provided in and on a semiconductor substrate. Lightly doped drain regions are formed within the semiconductor substrate. The substrate is covered with a photoresist layer which is patterned. A trench is etched into the substrate using the patterned photoresist layer as a mask. The photoresist layer is removed. A thick gate oxide layer is formed over the surface of the substrate and within the trench. A layer of silicon nitride is deposited over the gate oxide layer and anisotropically etched away to leave spacers on the sidewalls of the trench. The spacers are overetched to expose an upper portion of the gate oxide layer on the sidewalls of the trench. The gate oxide layer not covered by the spacers is removed, exposing the horizontal silicon surface of the substrate in the center of the bottom of the trench and the upper portion of the silicon sidewalls of the trench above the spacers. A tunnel oxide layer is grown on the exposed silicon surfaces of the substrate and within the trench wherein the controllable small area of tunnel oxide within the trench provides an improved coupling ratio and the long channel afforded by the trenched channel region reduces the short channel effect of the memory cell. The silicon nitride spacers are removed. A first polysilicon layer is deposited over the surface of the tunnel oxide and the gate oxide layers within the trench. The first polysilicon layer is doped. An interpoly dielectric layer is deposited over the first polysilicon layer. A second polysilicon layer is deposited overlying the dielectric layer and doped. The first and second polysilicon layers and the dielectric layer are patterned to form a stacked polysilicon structure wherein the first polysilicon layer forms a floating gate and the second polysilicon layer forms a control gate. Ions are implanted into the substrate using the stacked polysilicon structure as a mask to form source and drain regions on either side of the stacked polysilicon structure. Silicon oxide spacers are formed on the sidewalls of the stacked polysilicon structure. Passivation and metallization completes the fabrication of the memory cell.

BRIEF DESCRIPTION OF THE DRAWINGS

In the accompanying drawings forming a material part of this description, there is shown.

DESCRIPTION OF THE PREFERRED EMBODIMENTS

Figure 1:
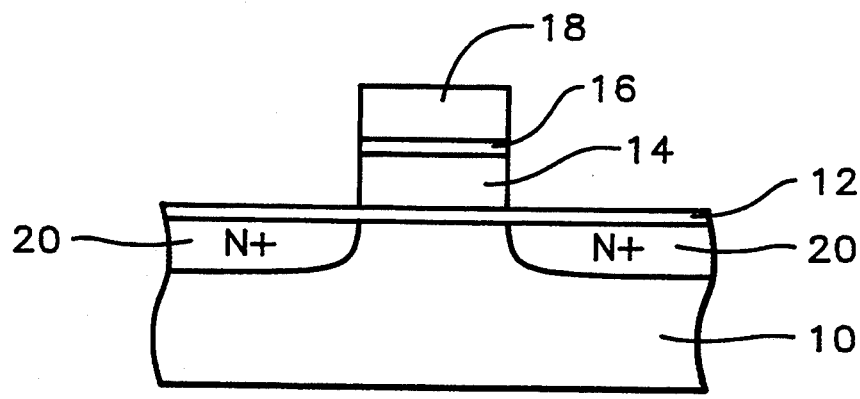
FIG. 1 schematically illustrates in cross-sectional representation a memory cell of the prior art.
Figure 2:
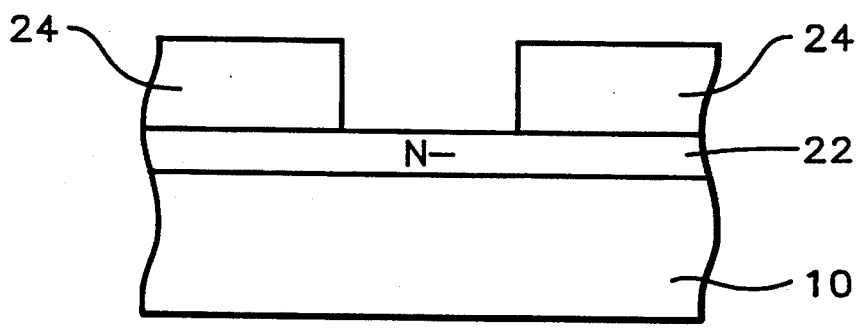
FIGS. 2 through 7 schematically illustrate in cross-sectional representation one preferred embodiment of the present invention.

Referring now more particularly to FIG. 2, the process of the present invention will be described. A portion of a partially completed integrated circuit is illustrated in FIG. 2 consisting of a semiconductor substrate 10, preferably composed of monocrystalline silicon. A local oxidation of silicon (LOCOS) process is performed to provide device isolation regions, not shown. A lightly doped drain ion implantation is made into the substrate to form lightly doped drain region 22. This is typically an implantation of phosphorus ions with a dosage of between about 5 E 13 to 5 E 14 atoms/cm$^2$ at a energy of between about 30 to 100 KeV.

Figure 3:
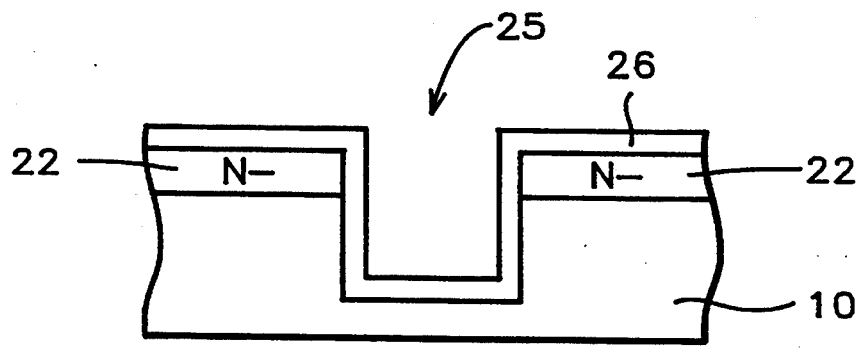

Next, a photoresist coating 24 is applied and patterned to provide a mask for a trench with a width of between about 3000 to 10,000 Angstroms. Referring now to FIG. 3, a trench is etched into the semiconductor substrate. The trench 25 is etched to a depth of between about 3000 to 8000 Angstroms. Next, thick gate oxide layer 26 is grown on the surface of the semiconductor substrate and within the trench. The gate oxide thickness is between about 200 to 300 Angstroms.

Figure 4:
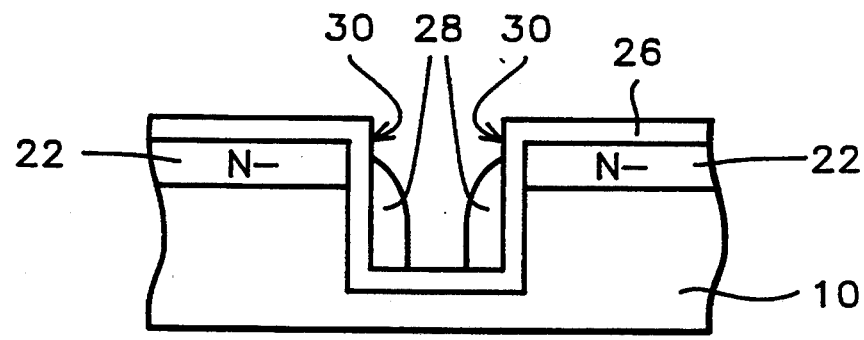

Referring now to FIG. 4, a layer of silicon nitride is deposited over the surface of the gate oxide layer to a thickness of between about 500 to 3000 Angstroms, depending upon the trench opening width. The silicon nitride layer is anisotropically etched to remove the layer leaving spacers 28 on the sidewalls of the trench. The spacers are overetched to provide room on the upper portions 30 of the sidewalls of the trench for the planned tunnel oxide region. This overetch can be between about 500 to 4000 Angstroms in depth. The smaller the tunnel oxide area, the better the coupling ratio.

Figure 5:
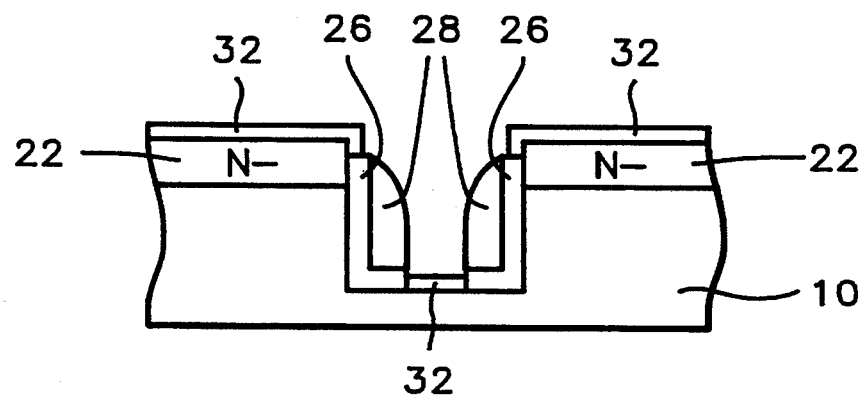

A silicon dioxide wet etch is used to remove the thick gate oxide not covered by the silicon nitride spacers. This will expose the silicon surfaces above the lightly doped drain regions 22 and within the trench at the center portion of the bottom surface and the upper portions of the sidewalls. The thin tunnel oxide 32 is grown on these exposed surfaces as shown in FIG. 5. The small controllable areas of tunnel oxide within the trench will provide the improved coupling ratio. The channel length along the etched trench region gives a longer channel length and results in a reduced short-channel effect for deep submicron devices. The tunnel oxide is grown to a preferred thickness of between about 60 to 100 Angstroms.

A wet etch is used to remove the silicon nitride spacers 28. This is typically done with phosphoric acid at between about 150° to 160° C. If some of the thin tunnel oxide is removed during the silicon nitride spacer etch, the tunnel oxide could be made thicker to begin with so that a sufficient thickness of tunnel oxide remains after the etch. Alternatively, a short regrow step can be performed to thicken the tunnel oxide.

Figure 6:
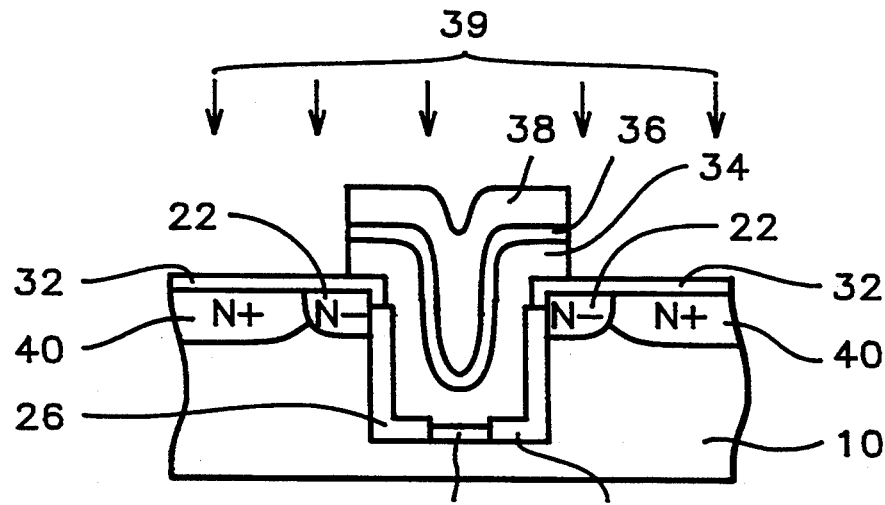

Referring now to FIG. 6, a layer of polysilicon 34 is deposited over the surface of the substrate and within the trench to a thickness of between about 1000 to 4000 Angstroms and doped. An interpoly dielectric 36, such as ONO (silicon oxide-silicon nitride-silicon oxide) is deposited over the polysilicon layer 34. A second polysilicon layer 38 is deposited over the dielectric 34 to a thickness of between about 2000 to 4000 Angstroms and doped. The first and second polysilicon layers and the interpoly dielectric layer are patterned to form a stacked polysilicon gate structure. The first polysilicon layer 34 forms the floating gate and the second polysilicon layer 38 forms the control gate of the memory cell.

Arsenic ions 39 are implanted into the substrate using the polysilicon gate structure as a mask to form source and drain regions 40 on either said of the stacked gate.

Figure 7:
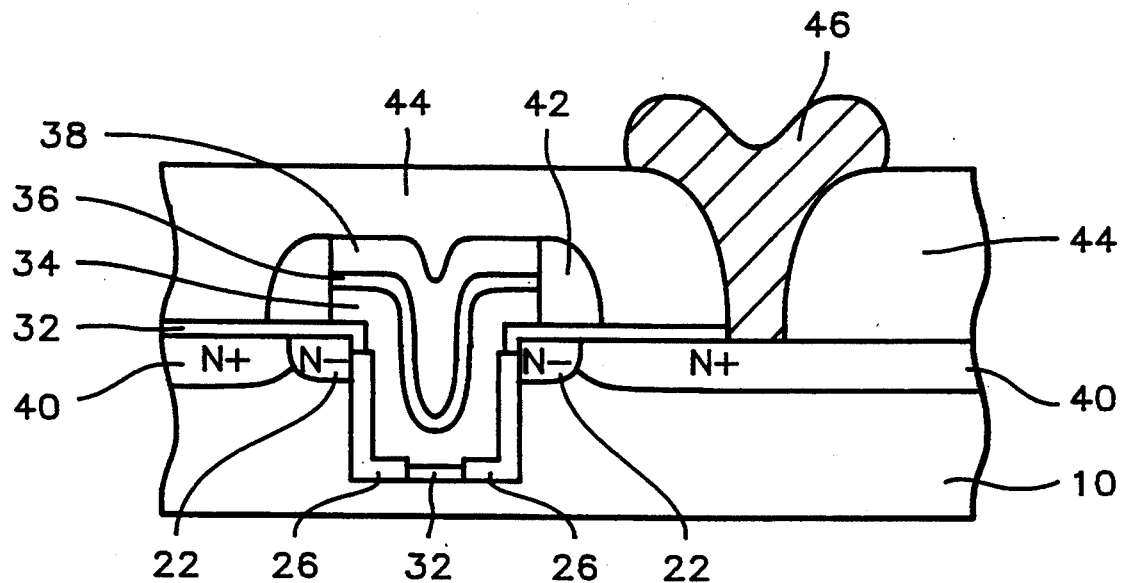

Back-end processing continues as is conventional in the art and as is illustrated in FIG. 7. Silicon dioxide spacers 42 are formed on the sidewalls of the stacked polysilicon gate structure. A dielectric layer 44, such as borophosphosilicate glass (BPSG), is deposited over the surface of the substrate. Contact openings are etched through the dielectric layer to expose the drain regions 40 where contact is desired. Metal layer 46, typically aluminum, is deposited and patterned to complete the contacts.

Figure 8:
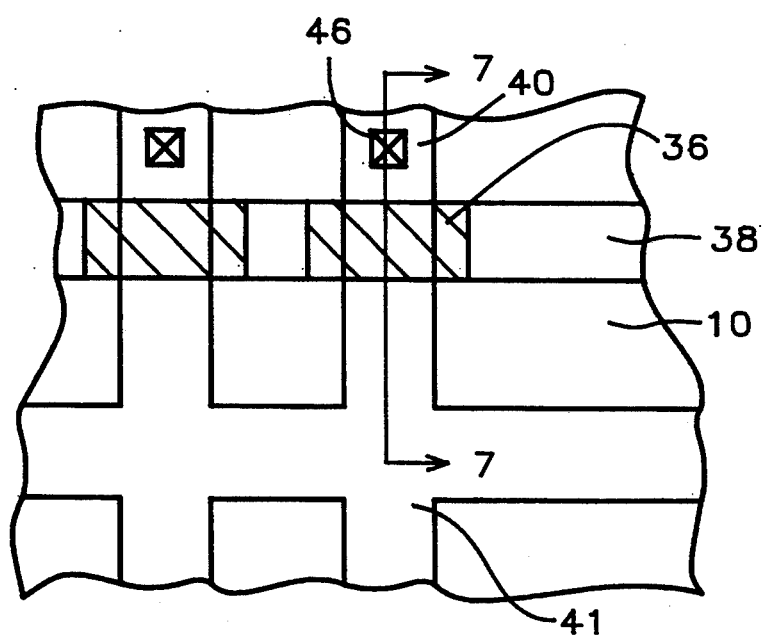
FIG. 8 illustrate a top plan view of the memory cell of the present invention.

A top view of the completed memory cell is shown in FIG. 8. View 7—7 is that shown in FIG. 7. The floating gate 36 and the control gate 38 are illustrated. The metal 46 completing contact is shown contacting the drain region 40. Source region 41 appears on the opposite side of the gates.

Figure 9:
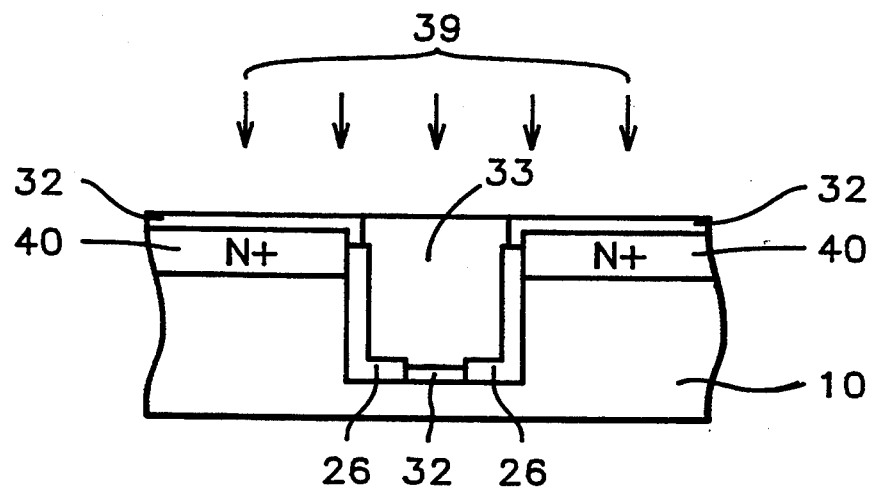
FIGS. 9 and 10 schematically illustrate in cross-sectional representation a second preferred embodiment of the present invention.
Figure 10:
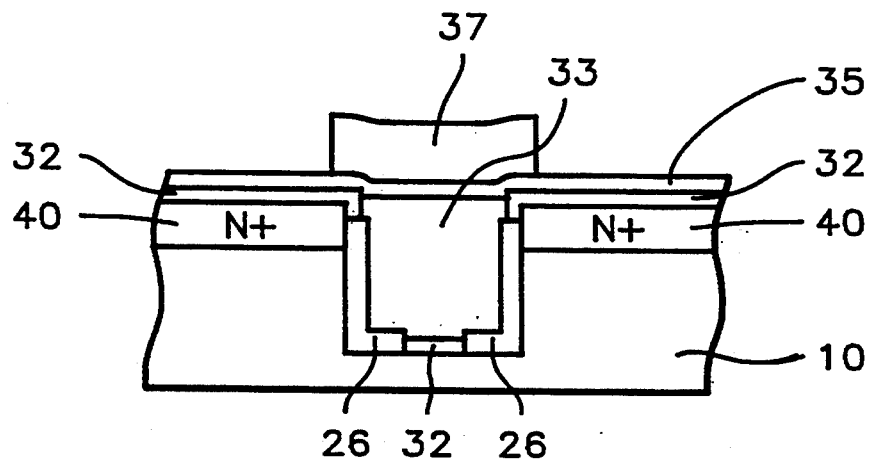

FIGS. 9 and 10 illustrate a second preferred embodiment of the present invention. The process proceeds as for the first embodiment through the steps illustrated in FIG. 5 and through the removal of the silicon nitride spacers. However, the process of forming the N- lightly doped drain region 22 can be omitted. In this embodiment, the first polysilicon layer 33 is deposited over the surface of the substrate and within the trench and doped, as above. However, the first polysilicon layer is deposited to a thickness sufficient to fill the trench, preferably between about 4000 to 10,000 Angstroms. As illustrated in FIG. 9, the polysilicon layer 33 is planarized, for example, by chemical mechanical polishing (CMP) to be flush with the surface of the substrate. This layer forms the floating gate of the memory cell.

Arsenic ions 39 are implanted into the substrate using the floating gate as a mask to form source and drain regions 40 on either said of the gate.

An interpoly dielectric 35, such as ONO (silicon oxide-silicon nitride-silicon oxide) is deposited over the floating gate 33. A second polysilicon layer 37 is deposited over the dielectric 35 to a thickness of between about 2000 to 4000 Angstroms and doped and patterned to form the control gate of the memory cell. Back-end processing is as described above.

The advantages of the present invention are: 1) the controllable small area of thin tunnel oxide results in a high coupling ratio for the flash memory, and 2) the raised source/drain area and longer channel length afforded by the trenched channel region reduces the short-channel effect for sub-micron devices.

The following Example is given to show the important features of the invention and to aid in the understanding thereof. Variations may be made by one skilled in the art without departing from the spirit and scope of the invention.

EXAMPLE

The following table gives an example of the operation conditions for the Flash EEPROM cell of the present invention.

TABLE 1

| Operation | $V_{W/L}$ | $V_D$ | $V_S$ | $V_{sub}$ |
|---|---|---|---|---|
| program | −10 V | +5 V | floating | 0 |
| flash-erase | +15 V | 0 | 0 | 0 |
| read | +5 V | +2 V | 0 | 0 |

Table 1 shows the wordline ($V_{W/L}$), drain ($V_D$), source ($V_S$), and substrate ($V_{sub}$) voltages which are reasonable operation conditions for a Flash EEPROM cell of the present invention.

While the invention has been particularly shown and described with reference to the preferred embodiments thereof, it will be understood by those skilled in the art that various changes in form and details may be made without departing from the spirit and scope of the invention.

What is claimed is:

1. The method of forming a memory cell with reduced coupling ratio and improved short channel effect comprising:
   providing field oxide regions in and on a semiconductor substrate;
   forming lightly doped drain regions within said semiconductor substrate;
   covering said substrate with a photoresist layer and patterning said photoresist layer;
   etching a trench into said substrate using said patterned photoresist layer as a mask wherein said trench will provide an increased channel length reducing said short-channel effect;
   removing said photoresist layer;

forming a gate oxide layer over the surface of said substrate and within said trench;

depositing a layer of silicon nitride over said gate oxide layer;

anisotropically etching said silicon nitride layer to leave spacers on the sidewalls of said trench;

overetching said spacers to expose an upper portion of said gate oxide layer on said sidewalls of said trench;

removing said gate oxide layer not covered by said spacers wherein the horizontal silicon surface of said substrate at the bottom of said trench and the upper portion of the silicon sidewalls of said trench above said spacers are exposed;

growing a tunnel oxide layer on the exposed silicon surfaces of said substrate and within said trench wherein the tunnel oxide within said trench provides an improved coupling ratio of said memory cell;

removing said silicon nitride spacers;

depositing a first polysilicon layer over the surface of said tunnel oxide and said gate oxide layers within said trench and doping said first polysilicon layer;

depositing an interpoly dielectric layer over said first polysilicon layer;

depositing a second polysilicon layer overlying said dielectric layer and doping said second polysilicon layer;

patterning said first and second polysilicon layers and said dielectric layer to form a stacked polysilicon structure wherein said first polysilicon layer forms a floating gate and said second polysilicon layer forms a control gate;

implanting ions into said substrate using said stacked polysilicon structure as a mask to form heavily doped source and drain regions on opposite sides of said stacked polysilicon structure;

forming silicon oxide spacers on the sidewalls of said stacked polysilicon structure; and providing passivation and metallization to complete the fabrication of said memory cell with improved coupling ratio and reduced short channel effect.

2. The method of claim 1 wherein said lightly doped drain implant is performed with phosphorus ions with a dosage of between about 5 E 13 to 5 E 14 atoms/cm$^2$ and energy of between about 30 to 100 KeV.

3. The method of claim 1 wherein said trench is etched to a depth of between about 3000 to 10,000 Angstroms.

4. The method of claim 1 wherein said gate oxide layer is grown to between about 200 to 300 Angstroms.

5. The method of claim 1 wherein said silicon nitride layer has a thickness of between about 500 to 3000 Angstroms.

6. The method of claim 1 wherein said overetching of said spacers is performed to a depth of between about 500 to 4000 Angstroms to provide room for said tunnel oxide to be grown to contact said lightly doped drain regions.

7. The method of claim 1 wherein said tunnel oxide is grown to a thickness of between about 60 to 100 Angstroms.

8. The method of claim 1 wherein said spacers are removed by phosphoric acid.

9. The method of claim 1 further comprising when said silicon nitride spacers are removed removing a portion of said tunnel oxide layer wherein said portion of said tunnel oxide layer removed is regrown.

10. The method of claim 1 wherein said first polysilicon layer is deposited to a thickness of between about 1000 to 4000 Angstroms.

11. The method of claim 1 wherein said interpoly dielectric layer is composed of silicon nitride, silicon oxide, and silicon nitride (ONO) layers with a combined thickness of between about 200 to 400 Angstroms.

12. The method of claim 1 wherein said second polysilicon layer is deposited to a thickness of between about 2000 to 4000 Angstroms.

13. The method of claim 1 wherein said interpoly dielectric layer is composed of silicon nitride, silicon oxide, and silicon nitride (ONO) layers.

14. The method of forming a memory cell with improved coupling ratio and reduced short channel effect comprising:

providing field oxide regions in and on a semiconductor substrate;

covering said substrate with a photoresist layer and patterning said photoresist layer;

etching a trench into said substrate using said patterned photoresist layer as a mask wherein said trench will provide an increased channel length reducing said short channel effect;

removing said photoresist layer;

forming a gate oxide layer over the surface of said substrate and within said trench;

depositing a layer of silicon nitride over said gate oxide layer;

anisotropically etching said silicon nitride layer to leave spacers on the sidewalls of said trench;

overetching said spacers to expose an upper portion of said gate oxide layer on said sidewalls of said trench;

removing said gate oxide layer not covered by said spacers wherein the horizontal silicon surface of said substrate at the bottom of said trench and the upper portion of the silicon sidewalls of said trench above said spacers are exposed;

growing a tunnel oxide layer on the exposed silicon surfaces of said substrate and within said trench wherein the tunnel oxide within said trench provides an improved coupling ratio of said memory cell;

removing said silicon nitride spacers;

depositing a first polysilicon layer over the surface of said tunnel oxide and said gate oxide layers within said trench and doping said first polysilicon layer;

planarizing said first polysilicon layer so that said first polysilicon layer remains only within said trench and wherein said first polysilicon layer forms a floating gate;

implanting ions into said substrate to form source and drain regions on opposite sides of said floating gate;

depositing an interpoly dielectric layer over the surface of said substrate and over said floating gate;

depositing a second polysilicon layer overlying said interpoly dielectric layer and doping said second polysilicon layer;

patterning said second polysilicon layer to form a control gate; and providing passivation and metallization to complete the fabrication of said memory cell with improved coupling ratio and reduced short channel effect.

15. The method of claim 14 wherein said lightly doped drain implant is performed with phosphorus ions with a dosage of between about 5 E 13 to 5 E 14 atoms/cm$^2$ and energy of between about 30 to 100 KeV.

16. The method of claim 14 wherein said trench is etched to a depth of between about 3000 to 10,000 Angstroms.

17. The method of claim 14 wherein said gate oxide layer is grown to between about 200 to 300 Angstroms.

18. The method of claim 14 wherein said silicon nitride layer has a thickness of between about 500 to 3000 Angstroms.

19. The method of claim 14 wherein said overetching of said spacers is performed to a depth of between about 500 to 4000 Angstroms to provide room for said tunnel oxide to be grown to contact said lightly doped drain regions.

20. The method of claim 14 wherein said tunnel oxide is grown to a thickness of between about 60 to 100 Angstroms.

21. The method of claim 14 wherein said spacers removed by phosphoric acid.

22. The method of claim 14 further comprising when said silicon nitride spacers are removed removing a portion of said tunnel oxide layer wherein said portion of said tunnel oxide layer removed is regrown.

23. The method of claim 14 wherein said first polysilicon layer is planarized by chemical mechanical polishing.

24. The method of claim 14 wherein said interpoly dielectric layer is composed of silicon nitride, silicon oxide, and silicon nitride (ONO) layers.

25. The method of claim 14 wherein said second polysilicon layer is deposited to a thickness of between about 2000 to 4000 Angstroms.

* * * * *